(12) United States Patent
Rinne (10) Patent No.: US 7,659,621 B2
(45) Date of Patent: Feb. 9, 2010

(54) SOLDER STRUCTURES FOR OUT OF PLANE CONNECTIONS

(75) Inventor: Glenn A. Rinne, Apex, NC (US)

(73) Assignee: Unitive International Limited, Curacao (NL)

( * ) Notice: Subject to any disclaimer, the term of this patent is extended or adjusted under 35 U.S.C. 154(b) by 347 days.

(21) Appl. No.: 11/362,964

(22) Filed: Feb. 27, 2006

(65) Prior Publication Data

US 2006/0138675 A1 Jun. 29, 2006

Related U.S. Application Data

(62) Division of application No. 10/965,640, filed on Oct. 13, 2004, now Pat. No. 7,049,216.

(60) Provisional application No. 60/510,819, filed on Oct. 14, 2003.

(51) Int. Cl.
*H01L 23/48* (2006.01)

(52) U.S. Cl. ............... 257/737; 257/779; 257/E23.015; 257/E23.037

(58) Field of Classification Search ............... 257/737, 257/739, E23.015, E23.002, E23.037, 779
See application file for complete search history.

(56) References Cited

U.S. PATENT DOCUMENTS

| | | |
|---|---|---|
| 3,105,869 A | 10/1963 | Branch et al. |
| 3,244,947 A | 4/1966 | Slater |
| 3,259,814 A | 7/1966 | Green |
| 3,274,458 A | 9/1966 | Boyer et al. |
| 3,316,465 A | 4/1967 | von Bermuth et al. |
| 3,458,925 A | 8/1969 | Napier et al. |

(Continued)

FOREIGN PATENT DOCUMENTS

DE  42 05 029 C  2/1993

(Continued)

OTHER PUBLICATIONS

Adema et al., *Flip Chip Technology: A Method for Providing Known Good Die with High Density Interconnections*, MCM '94 Proceedings, pp. 41-49, (1994).

(Continued)

*Primary Examiner*—Tuan N. Quach
(74) *Attorney, Agent, or Firm*—Myers Bigel Sibley & Sajovec, P.A.

(57) ABSTRACT

Methods of forming a solder structure may include providing a wafer including a plurality of die therein, and a solder wettable pad may be formed on one of the die adjacent an edge of the die. The solder wettable pad may have a length parallel to the edge of the die and a width perpendicular to the edge of the die wherein the length parallel to the edge of the die is greater than the width perpendicular to the edge of the die. A solder bump may be plated on the solder wettable pad, and the die may be separated from the wafer along the edge of the die after plating the solder bump on the solder wettable pad. Moreover, the solder bump may be reflowed on the solder wettable pad so that the solder structure extends laterally from the solder wettable pad beyond the edge of the die after separating the die from the wafer. Related structures are also discussed.

41 Claims, 10 Drawing Sheets

U.S. PATENT DOCUMENTS

| | | | |
|---|---|---|---|
| 3,461,357 | A | 8/1969 | Mutter et al. |
| 3,489,965 | A | 1/1970 | Helsdon |
| 3,501,681 | A | 3/1970 | Weir |
| 3,663,184 | A | 5/1972 | Wood et al. |
| 3,760,238 | A | 9/1973 | Hamer et al. |
| 3,770,874 | A | 11/1973 | Krieger et al. |
| 3,871,014 | A | 3/1975 | King et al. |
| 3,871,015 | A | 3/1975 | Lin et al. |
| 3,897,871 | A | 8/1975 | Zimnbauer |
| 3,916,080 | A | 10/1975 | Wakamatsu |
| 3,942,187 | A | 3/1976 | Gelsing et al. |
| 3,959,577 | A | 5/1976 | Frink |
| 3,986,255 | A | 10/1976 | Mandal |
| 3,993,123 | A | 11/1976 | Chu et al. |
| 4,074,342 | A | 2/1978 | Honn et al. |
| 4,113,578 | A | 9/1978 | Del Monte |
| 4,113,587 | A | 9/1978 | Chikamori |
| 4,168,480 | A | 9/1979 | De Lucia |
| 4,244,002 | A | 1/1981 | Sato et al. |
| 4,257,905 | A | 3/1981 | Christophorou et al. |
| 4,266,282 | A | 5/1981 | Henle et al. |
| 4,273,859 | A | 6/1981 | Mones et al. |
| 4,382,517 | A | 5/1983 | Welsch |
| 4,449,580 | A | 5/1984 | Reisman et al. |
| 4,473,263 | A | 9/1984 | Sunstein |
| 4,511,873 | A | 4/1985 | Baier et al. |
| 4,532,576 | A | 7/1985 | Reimer |
| 4,545,610 | A | 10/1985 | Lakritz et al. |
| 4,563,697 | A | 1/1986 | Miura |
| 4,565,901 | A | 1/1986 | Hirooka et al. |
| 4,657,146 | A | 4/1987 | Walters |
| 4,661,375 | A | 4/1987 | Thomas |
| 4,840,302 | A | 6/1989 | Gardner et al. |
| 4,855,809 | A | 8/1989 | Malhi et al. |
| 4,878,611 | A | 11/1989 | Lo Vasco et al. |
| 4,897,508 | A | 1/1990 | Mahulikar et al. |
| 4,927,505 | A | 5/1990 | Sharma et al. |
| 4,948,754 | A | 8/1990 | Kondo et al. |
| 4,950,623 | A | 8/1990 | Dishon |
| 4,962,058 | A | 10/1990 | Cronin et al. |
| 5,019,943 | A | 5/1991 | Fassbender |
| 5,022,580 | A | 6/1991 | Pedder |
| 5,024,372 | A | 6/1991 | Altman et al. |
| 5,046,161 | A | 9/1991 | Takada |
| 5,048,747 | A | 9/1991 | Clark et al. |
| 5,113,314 | A | 5/1992 | Wheeler et al. |
| 5,135,155 | A | 8/1992 | Kang et al. |
| 5,160,409 | A | 11/1992 | Moore et al. |
| 5,162,257 | A | 11/1992 | Yung |
| 5,194,137 | A | 3/1993 | Moore et al. |
| 5,227,664 | A | 7/1993 | Toshio |
| 5,234,149 | A | 8/1993 | Katz et al. |
| 5,239,447 | A | 8/1993 | Cotues et al. |
| 5,240,588 | A | 8/1993 | Cayetano et al. |
| 5,250,843 | A | 10/1993 | Eichelberger |
| 5,289,925 | A | 3/1994 | Newmark |
| 5,293,006 | A | 3/1994 | Yung |
| 5,325,265 | A | 6/1994 | Turlik et al. |
| 5,327,013 | A | 7/1994 | Moore et al. |
| 5,327,327 | A | 7/1994 | Frew et al. |
| 5,335,795 | A | 8/1994 | Chizen |
| 5,347,428 | A | 9/1994 | Carson et al. |
| 5,354,711 | A | 10/1994 | Heitzmann et al. |
| 5,406,701 | A | 4/1995 | Pepe et al. |
| 5,424,920 | A | 6/1995 | Miyake |
| 5,432,729 | A | 7/1995 | Carson et al. |
| 5,453,582 | A | 9/1995 | Amano et al. |
| 5,475,280 | A | 12/1995 | Jones et al. |
| 5,492,235 | A | 2/1996 | Crafts et al. |
| 5,547,740 | A | 8/1996 | Higdon et al. |
| 5,557,502 | A | 9/1996 | Bannerjee et al. |
| 5,616,962 | A | 4/1997 | Ishikawa et al. |
| 5,627,396 | A | 5/1997 | James et al. |
| 5,680,296 | A | 10/1997 | Hileman et al. |
| 5,736,456 | A | 4/1998 | Akram |
| 5,739,053 | A | 4/1998 | Kawakita et al. |
| 5,744,382 | A | 4/1998 | Kitayama et al. |
| 5,751,556 | A | 5/1998 | Butler et al. |
| 5,773,359 | A | 6/1998 | Mitchell et al. |
| 5,793,116 | A | 8/1998 | Rinne et al. |
| 5,812,378 | A | 9/1998 | Fielstad et al. |
| 5,851,911 | A | 12/1998 | Farnworth |
| 5,898,574 | A | 4/1999 | Tan et al. |
| 5,923,539 | A | 7/1999 | Matsui et al. |
| 5,963,793 | A | 10/1999 | Rinne et al. |
| 5,990,472 | A | 11/1999 | Rinne |
| 6,134,120 | A | 10/2000 | Baldwin |
| 6,167,615 | B1* | 1/2001 | Ma et al. ............ 29/840 |
| 6,169,325 | B1 | 1/2001 | Azuma |
| 6,201,305 | B1 | 3/2001 | Darveaux et al. |
| 6,268,655 | B1 | 7/2001 | Farnworth et al. |
| 6,310,390 | B1 | 10/2001 | Moden |
| 6,388,203 | B1 | 5/2002 | Rinne et al. |
| 6,392,163 | B1 | 5/2002 | Rinne et al. |
| 6,404,064 | B1 | 6/2002 | Tsai et al. |
| 6,414,374 | B2 | 7/2002 | Farnworth et al. |
| 6,418,033 | B1 | 7/2002 | Rinne |
| 6,539,624 | B1 | 4/2003 | Kung et al. |
| 6,825,547 | B2 | 11/2004 | Farnworth et al. |
| 6,900,079 | B2 | 5/2005 | Kinsman et al. |
| 2002/0020551 | A1 | 2/2002 | Rinne et al. |
| 2003/0102560 | A1 | 6/2003 | Kim et al. |
| 2004/0187296 | A1* | 9/2004 | Cowles et al. ............ 29/603.07 |

FOREIGN PATENT DOCUMENTS

| | | |
|---|---|---|
| DE | 43 23 799 A1 | 1/1994 |
| EP | 0 609 062 A1 | 8/1994 |
| EP | 0 736 972 A1 | 10/1996 |
| EP | 0 918 355 A2 | 5/1999 |
| EP | 1 041 617 A1 | 10/2000 |
| FR | 2 406 893 | 10/1978 |
| FR | 2 688 628 | 9/1993 |
| FR | 2 705 832 | 12/1994 |
| GB | 1288564 | 9/1972 |
| GB | 2062 963 | 5/1981 |
| GB | 2 194 387 | 3/1988 |
| JP | 55-111127 | 8/1980 |
| JP | 57-73952 | 5/1982 |
| JP | 57-197838 | 12/1982 |
| JP | 59-154041 | 9/1984 |
| JP | 6-116552 | 1/1986 |
| JP | 63099558 | 4/1988 |
| JP | 63-222445 | 9/1988 |
| JP | 4-150033 | 5/1992 |
| JP | 07066207 | 1/1994 |
| WO | WO 93/02831 | 2/1993 |
| WO | WO 93/22475 | 11/1993 |
| WO | WO 96/31905 | 10/1996 |
| WO | WO 98/06118 | 2/1998 |

OTHER PUBLICATIONS

Datta et al., *Electrochemical Fabrication of Mechanically Robust PbSn C4 Interconnections*, J. Electrochem. Soc., vol. 142, No. 11, The Electrochemical Society, Inc., Nov. 1995, pp. 3779-3785.

Drake et al; *An Electrostatically Actuated Micro-Relay*, Transducers '95, Eurosensors IX, The 8th International Conference on Solid-State Sensors and Actuators, and Eurosensors IX, pp. 380-383, (1995).

Guckel et al., *Electromagnetic Linear Actuators with Inductive Position Sensing for Micro Relay, Micro Value and Precision Positioning Applications*, Transducers '95, Eurosensors IX, The 8th International Conference on Solid-State Sensors and Actuators, and Eurosensors IX, pp. 324-327, (1995).

Hashimoto et al; *Thermally Controlled Magnetization Microrelay*, Transducers '95, Eurosensors IX, The 8$^{th}$ International Conference on Solid-State Sensors and Actuators, and Eurosensors IX, pp. 361-364, (1995).

Hirsch, *Tin-Lead, Lead and Tin Plating*, Metal Finishing, Guidebook Directory 1987, 55$^{th}$ Guidebood-Directory Issue 1987, Mid Jan. 1987, vol. 85, No. 1A, ISSN 0026-0576, pp. 280-284.

Hosaka et al; Electromagnetic Microrelays: Concepts and Fundamental Characteristics, Sensors and Actuators A, 40 (1994), pp. 41-47.

Howell et al: "Area Array Solder Interconnection Technology for the Three-Dimensional Silicon Cube" Proceedings of the 1995 45$^{th}$ Electronic Components & Technology Conference, pp. 1174-1178, (1995).

Inaba et al; *Solder Bump Formation Using Electroless Plating and Ultrasonic Soldering*, IEEE Transactions On Components, Hybrids, and Manufacturing Technology, vol. 13, No. 1, Mar. 1990, pp. 119-123.

International Search Report and Written Opinion of the International Searching Authority for International patent application No. PCT/US2004/033946 mailed on Jul. 4, 2005.

Knüppel, *Rugged Design for Reliable Switching: Micro a Relay Sets New Automotive Standards*, Components XXIX (1994), No. 4, pp. 30-32.

Lineback, "3D IC Packaging Moves Closer to Commercial Use", Electronic World News, May 21, 1990, p. 15.

Multimedia Card Association, www.mmca.org, (2004).

PCB Assembly, *Electronic Packaging & Production*, vol. 35, No. 1, p. 40 (Jan. 1995).

SanDisk Corporation, SanDisk Flash Data Storage, San Disk Compact Flash™ and MultiMedia Card: Small Form Factor Solutions, 1999.

Specification Sheet, *NaiS, Ultra Low Profile 2 Amp-Polarized Relay*, TK-Relays, (2004).

* cited by examiner

Surface Curvature at a Point

SOLDER STRUCTURES FOR OUT OF PLANE CONNECTIONS

RELATED APPLICATION

This application claims the benefit of priority as a divisional application to U.S. patent application Ser. No. 10/965,640 filed Oct. 13, 2004, U.S. Pat. No. 7,049,216, which claims the benefit of priority to U.S. Provisional Application No. 60/510,819 filed Oct. 14, 2003. The disclosures of both of the above referenced applications are hereby incorporated herein in their entirety by reference.

FIELD OF THE INVENTION

The present invention relates to the field of electronics, and more particularly, to structures for bonding electronic substrates and related methods.

BACKGROUND

In packaging microelectronic devices, such as packaging integrated circuit chips en printed circuit boards, the integrated circuit chips are generally mounted parallel to and facing the printed circuit board such that faces of the integrated circuit chips are adjacent a face of the circuit board. This packaging technology allows a large number of input/output connections between the integrated circuit chips and the printed circuit board, especially when solder bump technology is used over the entire face of the integrated circuit chips. However, this technology may limit a packaging density, because the large faces of the integrated circuit chips are mounted adjacent the face of the printed circuit board.

To increase the packaging density of chips on a printed circuit board, three-dimensional packaging has been proposed, wherein the chips are mounted orthogonal to the circuit board so that edges of the chips are adjacent the face of the circuit board. See, for example, U.S. Pat. No. 5,347,428 to Carson et al. entitled "Module Comprising IC Memory Stack Dedicated to and Structurally Combined With an IC Microprocessor Chip" and U.S. Pat. No. 5,432,729 to Carson et al. entitled "Electronic Module Comprising a Stack of IC Chips Each Interacting With an IC Chip Secured to the Stack", both of which are assigned to Irvine Sensors Corporation. In these patents, solder bumps are used to connect the edges, rather than the faces of integrated circuit chips to a substrate. Unfortunately, an edge-to-face connection may be difficult and costly to produce.

U.S. Pat. No. 5,113,314 to Wheeler et al. entitled "High Speed, High Density Chip Mounting" describes another three-dimensional packaging technique. The '314 patent describes a plurality of integrated circuit chips whose active faces are perpendicular to a chip carrier. Solder bumps are used to connect pads on the chips to pads on the substrate.

An issue in using solder bump technology to interconnect a three-dimensional package is how to get the solder bump to bridge from one substrate to another. In particular, it may be difficult to form solder which extends beyond the edge of a chip because a chip sawing or dicing operation may remove solder which extends beyond the chip edge. Moreover, during solder reflow, the solder may take the shape of a hemisphere or partial hemisphere on a contact pad. Thus, it may be difficult to cause the solder on one contact pad to extend onto another contact pad, in a three-dimensional package. Even if solder is placed on a pair of adjacent contact pads in a three-dimensional package, it may be difficult to cause the reflowed solder to join up, rather than forming individual solder bumps.

Solder interconnections are also discussed in U.S. Pat. Nos. 5,793,116; 6,418,033; and 6,392,163. Each of these patents are assigned to the assignee of the present invention, and the disclosures of each of these patents are hereby incorporated herein in their entirety by reference.

SUMMARY

According to embodiments of the present invention, a solder structure may include a substrate and a solder wettable pad on the substrate adjacent an edge of the substrate. The solder wettable pad may have a length parallel to the edge of the substrate and a width perpendicular to the edge of the substrate wherein the length parallel to the edge of the substrate is greater than the width perpendicular to the edge of the substrate. In addition, a solder bump on the solder wettable pad may extend laterally from the solder wettable pad at least to within about 10 microns of the edge of the substrate. According to some embodiments, the solder bump may extend laterally from the solder wettable pad to and/or beyond the edge of the substrate.

According to additional embodiments of the present invention, a method of forming a solder structure may include providing a wafer including a plurality of die therein, and forming a solder wettable pad on one of the die adjacent an edge of the die. The solder wettable pad may have a length parallel to the edge of the die and a width perpendicular to the edge of the die wherein the length parallel to the edge of the die is greater than the width perpendicular to the edge of the die. A solder bump may be formed on the solder wettable pad, and the die may be separated from the wafer along the edge of the die after plating the solder bump on the solder wettable pad. After separating the die from the wafer, the solder bump on the solder wettable pad may be reflowed so that the solder structure extends laterally from the solder wettable pad toward the edge of the die. According to some embodiments, the solder bump may extend laterally to and/or beyond the edge of the die.

According to still additional embodiments of the present invention, a method of forming a solder structure may include providing a wafer including a plurality of die therein, and forming a solder wettable pad on one of the die adjacent an edge of the die. A solder bump may be formed on the solder wettable pad such that the solder bump is maintained within the edge of the die, and the die may be separated from the wafer along the edge of the die after forming the solder bump on the solder wettable pad. After separating the die from the wafer, the solder bump on the solder wettable pad may be subjected to reflow so that the solder bump extends laterally from the solder wettable pad to at least within about 10 microns of the edge of the die. According to some embodiments, the solder bump may extend to and/or beyond the edge of the die.

According to yet additional embodiments of the present invention, a method of forming a solder structure may include forming a solder wettable pad on a substrate adjacent an edge of the substrate. The solder wettable pad may have a length parallel to the edge of the substrate and a width perpendicular to the edge of the substrate wherein the length parallel to the edge of the substrate is greater than the width perpendicular to the edge of the substrate. In addition, a solder bump may be formed on the solder wettable pad wherein the solder bump extends laterally from the solder wettable pad to at least within about 10 microns of the edge of the substrate. According to some embodiments, the solder bump may extend to and/or beyond the edge of the substrate.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
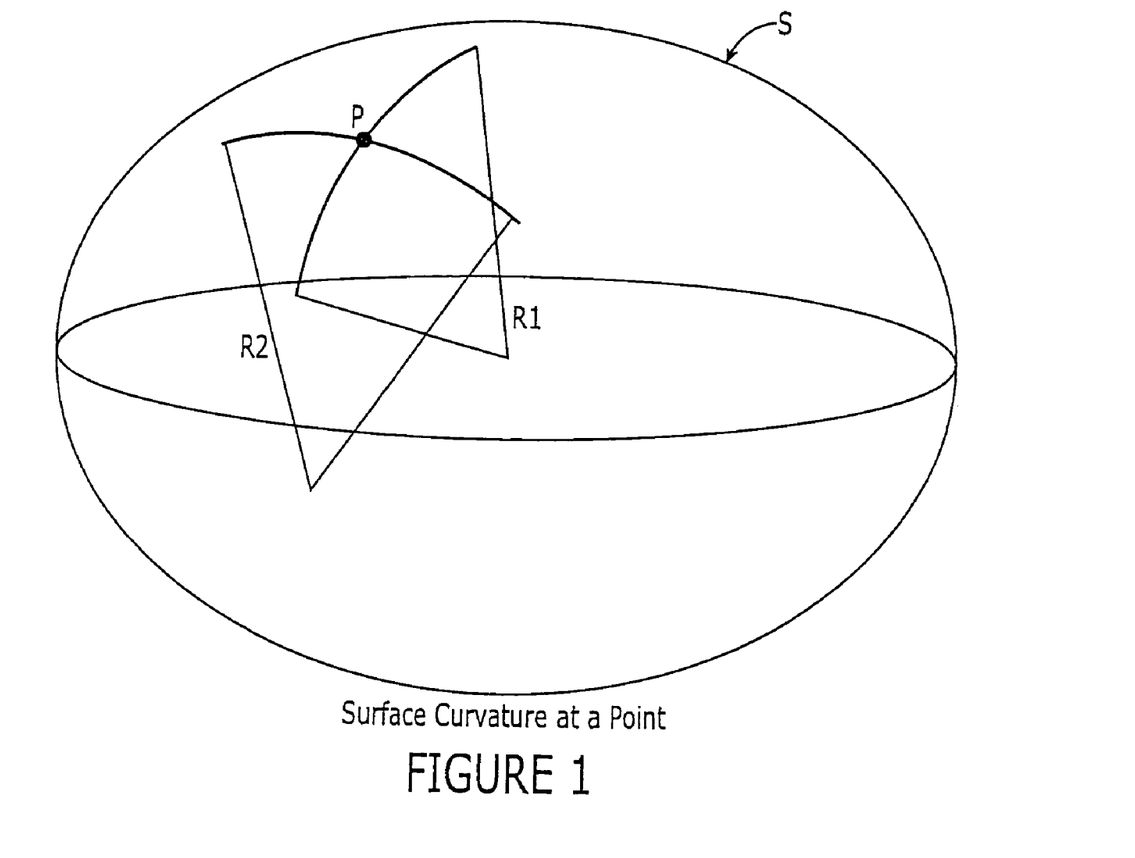
FIG. 1 is a diagram illustrating surface curvature at a point on an air-liquid interface according to embodiment of the present invention.

According to embodiments of the present invention, reservoir and pad geometries may provide bump overhang and increase a range of applications, and in particular applications with relatively fine pitch. In the analysis of Laplace-Young, at any point P on a surface S, the curvature of S at P can be represented by two orthogonal arcs or principal radii R1 and R2, as shown in FIG. 1.

If S represents an air-liquid interface, then the pressure difference across the surface is:

$$\Delta P = \gamma \left( \frac{1}{R_1} + \frac{1}{R_2} \right). \quad [1]$$

For a spherical liquid body, this reduces to:

$$\Delta P = \frac{2\gamma}{R}, \quad [2]$$

where ( is the surface tension difference across the interface. This pressure may also represent a potential energy of the surface. Since natural forces may tend to reduce energy, the liquid surface may tend to increase R1 and R2.

According to embodiments of the present invention, solder bumps may be placed (such as by plating) adjacent the edge of a die or substrate in a wafer, and the wafer including the die or substrate may be diced or sawed to singulate the die or substrate. More particularly, a die may include a plurality of integrated circuits (such as transistors, resistors, capacitors, diodes, inductors, etc.) therein and a wafer may include a plurality of such die. The solder bumps on the die can then be melted (after singulating the die) to form solder bump structures extending beyond the edge of the die or substrate, and to cause the solder bump structures to touch and wet to pads on a mating substrate oriented at an angle to the edge of the die or substrate. The mating substrate, for example, may be another integrated circuit device and/or a printed circuit board.

In addition, an overhang of solder may be increased to accommodate uncertainty in the width of a dicing kerf after dicing. Moreover, pitch or center-to-center spacing of these solder bumps on a die may be reduced to increase the number of interconnections along the edge of the die or substrate. A formation of extraneous solder structures due to inherent instabilities and/or perturbations of the manufacturing processes may also be reduced.

Structures according to embodiments of the present invention are discussed below with respect to FIGS. 2A-I. In each of FIGS. 2A-I, there are provided corresponding cross-sectional and top views of solder bump structures according to embodiments of the present invention.

Figures 2A, 2B:
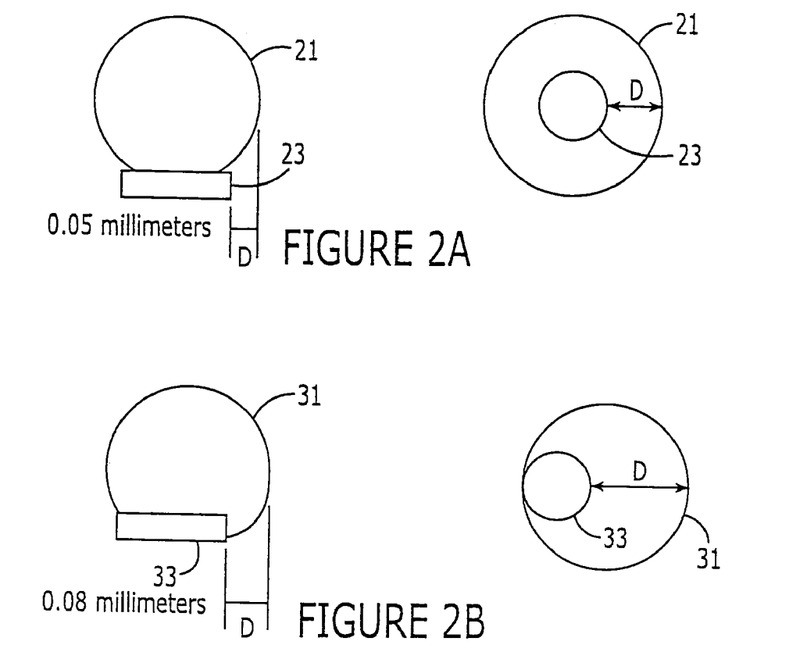
FIGS. 2A-I are cross-sectional and corresponding top views of bump structures according to embodiments of the present invention.
Figure 3:
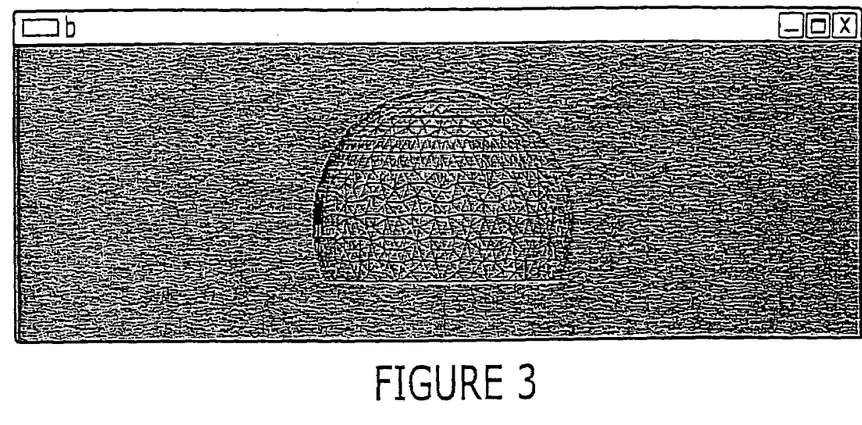
FIGS. 3-9, 11, and 12 are views of solder structures according to embodiments of the present invention.

A super-hemispheric bump geometry is shown in FIG. 2A. The bump 21 circumference (outer circle) is concentric with the bump pad 23 (inner circle). A relatively large volume of solder may be required for this approach. The solder bump 21 may be formed using a sequence including solder plating through a mask, followed by dicing, followed by solder reflow. Because the solder reflow follows dicing, interference of the plated solder deposit with the dicing blade can be reduced, yet the solder may overhang the edge of the die (separated by dicing) after reflow. To deposit enough solder to create the super-hemisphere, the plating template photoresist and the plated solder deposit may need to be very thick. The thick photoresist and plating may result in significant cost, throughput, yield, and pitch constraints. A super-hemispheric bump is illustrated in FIG. 3. In alternatives, the solder bump 21 may be formed, for example, using evaporation, jetting, and/or paste.

According to embodiments of the present invention illustrated in FIGS. 2A and 3, a plurality of solder bumps 21 may be plated on respective bump pads 23 along an edge of an integrated circuit die before dicing the die from a wafer including a plurality of die. The originally plated solder may be substantially cylindrical (before reflow) so that the plated solder does not extend significantly beyond the respective bump pad 23 before reflow. Accordingly, the die can be singulated before reflow without significantly interfering with the plated solder bump. After dicing, the solder bump 21 can be subjected to reflow so that the reflowed solder bump 21 extends beyond the bump pad 23 by an overhang distance D. By providing that the overhang distance D is greater than a distance between the edge of bump pad 23 after reflow, the bump may contact a pad on another substrate at the edge of the die having the solder bump 23 thereon.

In FIG. 2B, the solder bump 31 is directionally offset from the pad 33 to increase the overhang D. This offset may be possible if the solder can wet the side of the pad, which means the pad must have significant thickness and must be selectively wettable on one side. Selective wetting may be possible through selective oxidation or coating, the selective removal of oxide on the wetted side, or directional resist removal. However, the thickness of the solder deposit may be substantial and the cost may be high, while the control of directional wetting may be challenging.

Figure 2C:
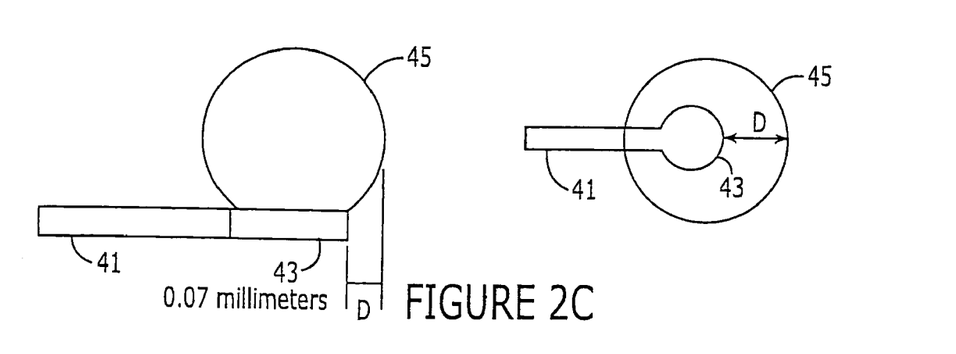

In FIG. 2C, a reservoir of solder is provided in the form of a narrow elongated region 41 connected to the bump pad 43. Differential pressure in the molten solder 45 may cause the solder in the reservoir to flow to the bump pad during reflow. A thickness requirement for the plated solder may thus be reduced, and/or an overhang distance D may be increased. Accordingly, cost may be reduced, and throughput may be increased. Solder reservoirs are discussed in greater detail in U.S. Pat. No. 6,388,203, the disclosure of which is hereby incorporated herein in its entirety by reference.

Figure 2D:
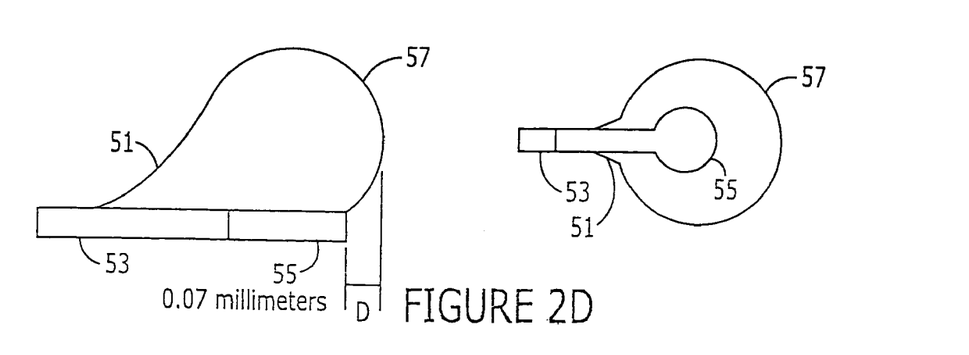
Figure 4:
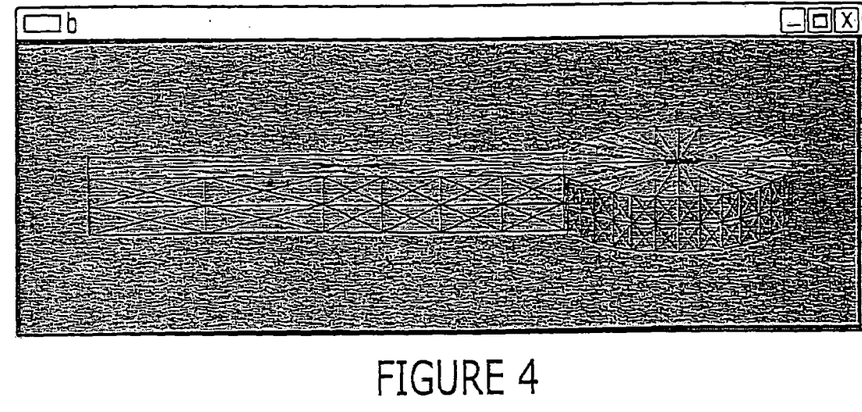
Figure 5:
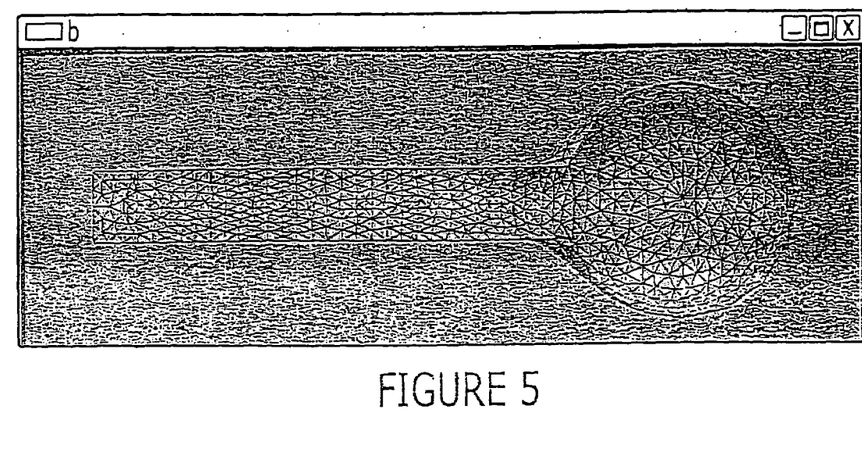
Figure 6:
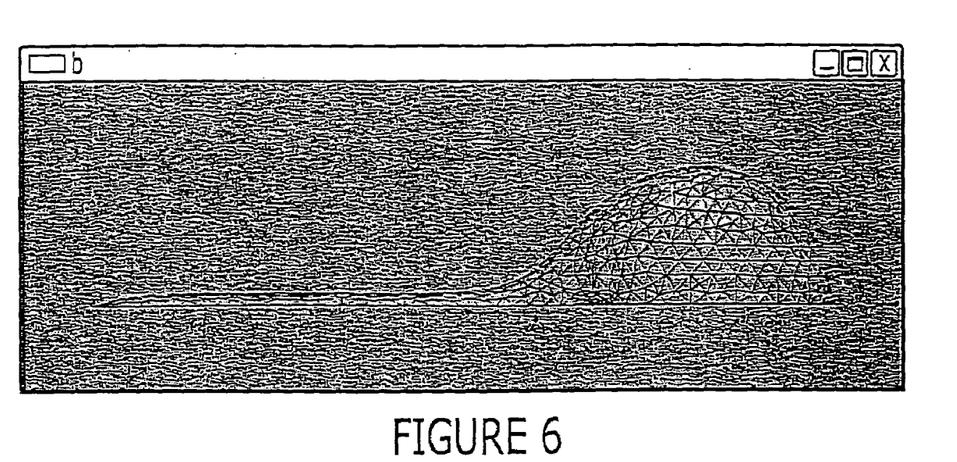

FIG. 2D is a more realistic representation of the structure of FIG. 2C. Here the tendency of liquid solder to reduce surface energy by increasing the radii of curvature may result in a pronounced meniscus 51 (neck) at the transition from the reservoir 53 to the bump pad 55 (see FIG. 6). This may have two effects. First, a relatively large volume of solder may be trapped in the meniscus 51. Second, a radius of curvature of the bump 57 may increase along the diameter aligned to the point of connection between reservoir and pad. The first effect may negate some of the advantage of the reservoir and the second may reduce the overhang by increasing the effective diameter of the wetted pad. FIG. 4 shows a plan view of plated solder on a circular bump pad and on a rectangular reservoir prior to reflow. FIGS. 5 and 6 show respective top and plan views of the solder of FIG. 4 after being subjected to reflow. The structures of FIGS. 5 and 6 correspond to those of FIG. 2D.

Figure 2E:
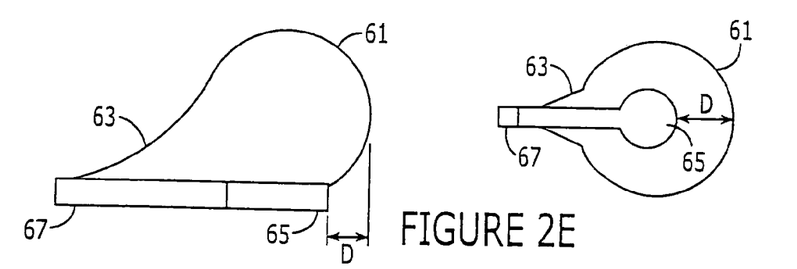
Figure 7:
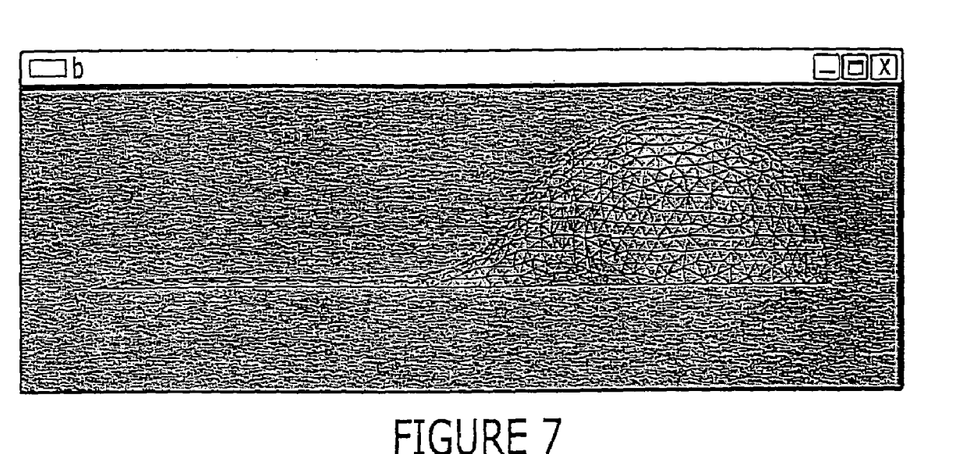

In FIG. 2E, attempts to increase the overhang D of solder bump 61 from pad 65 by simply increasing the volume may net little gain because the meniscus 63 on reservoir 67 may grow larger and the effective wetted diameter may increase. As shown in FIG. 7, increasing a solder volume may increase the size of meniscus 63 so that the overhand D does not increase significantly.

Figure 2F:
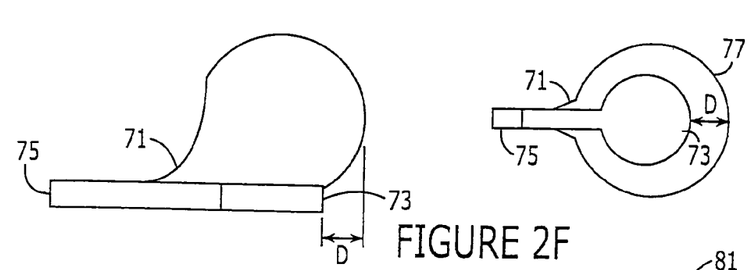
Figure 2G:
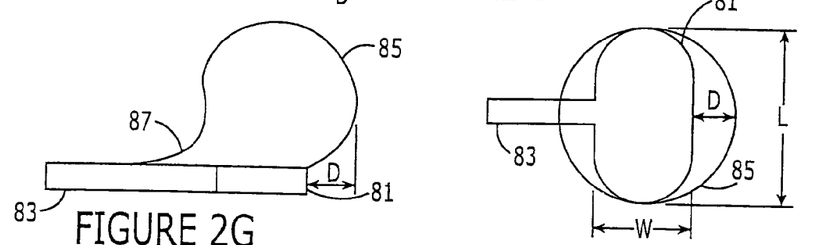

A size of the meniscus 71 (neck) can be reduced by changing the pressure differential, by either increasing the diameter of pad 73 or reducing the width of reservoir 75, as shown in FIG. 2F. Increasing the diameter of pad 73 may affect the pitch and the volume of solder needed to achieve a given overhang D of solder bump 77. Decreasing the width of reservoir 75 may decrease the volume of the reservoir. Both effects may be counter to the goal.

Figure 8:
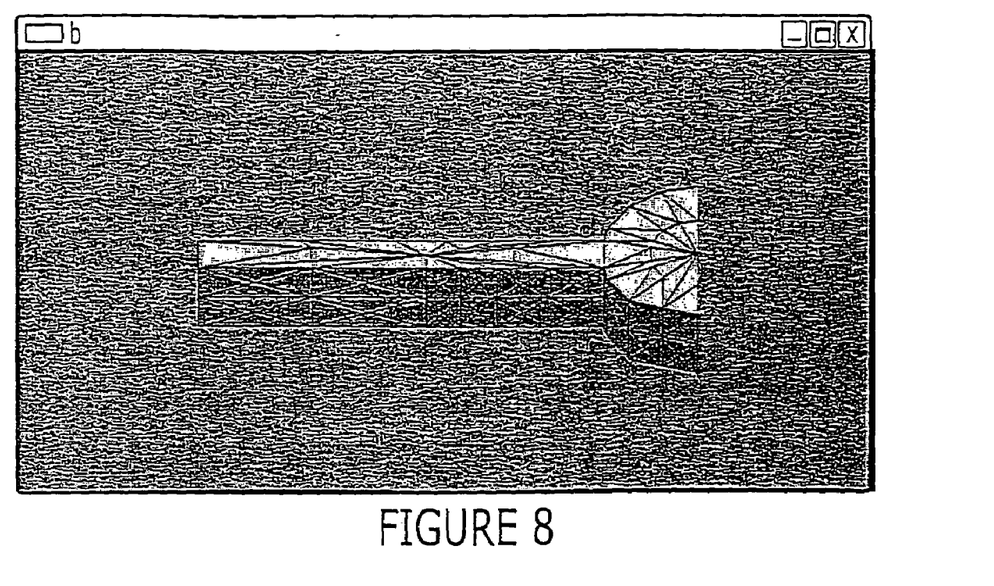
Figure 9:
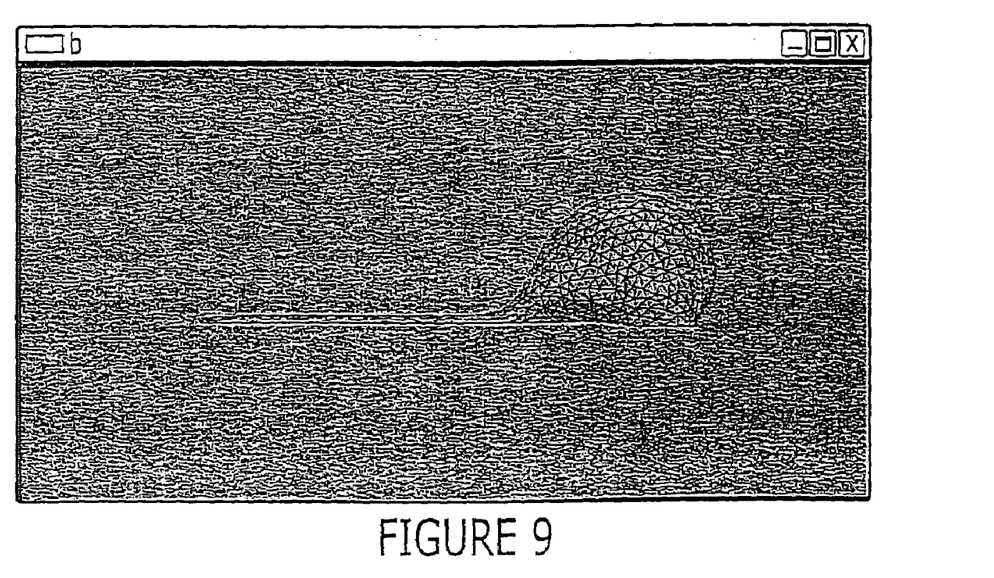

Increasing the pad diameter to reduce internal pressure and reducing pad diameter to increase overhang can be decoupled, as seen in the Laplace-Young equation. Recognition that the two principal radii are different allows the oval design of FIG. 2G. The radius of pad 81 parallel to the edge of the die can be relatively large so the internal pressure is lower and the meniscus 87 (neck) is smaller. The radius of pad 81 perpendicular to the die edge can be relatively narrow to increase the solder bump 85 overhang. Stated in other words, the pad 81 may have a length L parallel to the die edge that is greater than a width W perpendicular to the die edge. A geometry that exhibits different principal radii is the truncated circle or 'D' shaped pad shown in FIGS. 8 and 9.

Figure 2H:
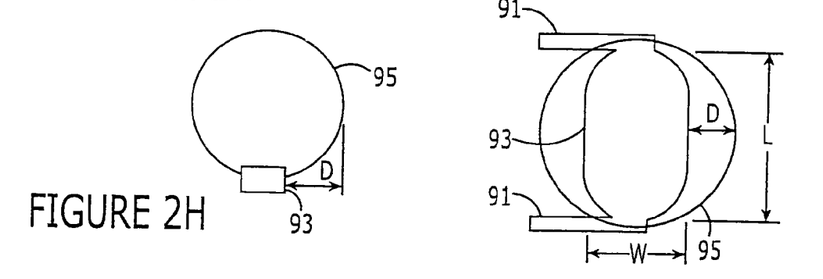

Further improvement can be seen in FIG. 2H where the point of connection between the reservoirs 91 and the pad 93 has been moved to the sides of the pad 93. Two reservoirs 91 may be used to retain symmetry. In this case, the reservoirs 91 may not significantly increase the diameter/width W of pad 93 (perpendicular to the die edge) so the overhang of solder bump 95 can be improved.

Figure 2I:
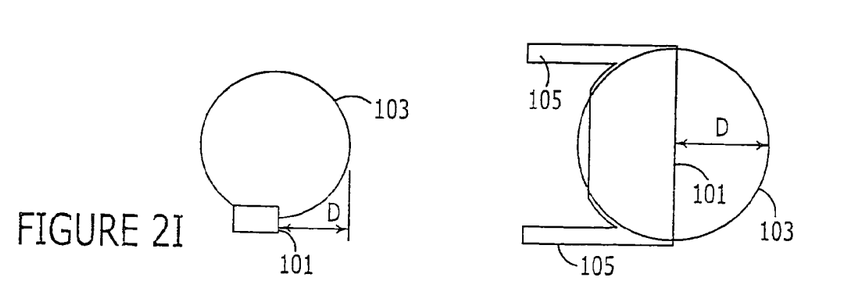

Since the liquid will not form a sharp angle, squaring the corners of pad 101 along the die edge as shown in FIG. 2I, may pull the solder 103 toward the pad edge, thus improving overhang D further. Reservoirs 105 may be provided at ends of the pad 101.

Figure 10:
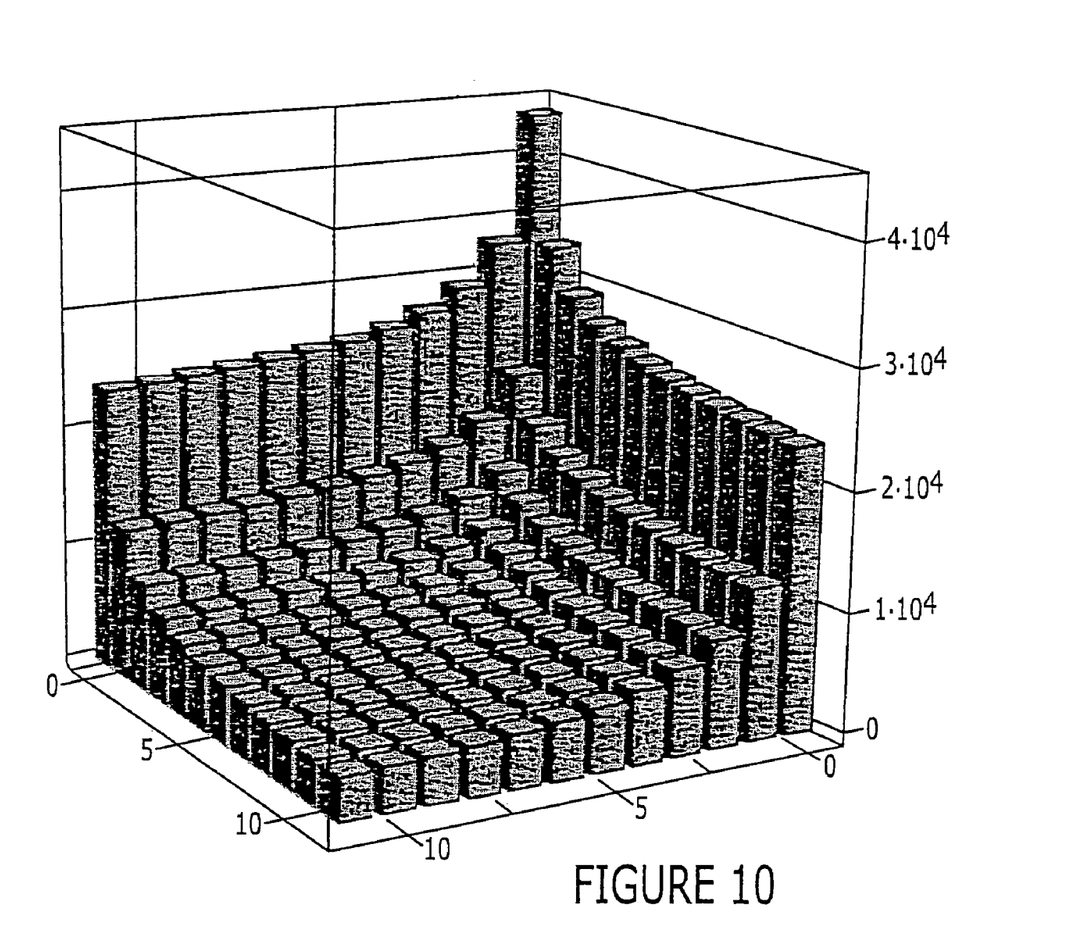
FIG. 10 is a graph illustrating internal pressure of a solder structure as a function of length of principal radii according to embodiments of the present invention.

These designs may work because the internal pressure may be dominated by the smaller of the two principal radii. FIG. 10 shows the internal pressure as the two radii are varied. It can be seen that the pressure may be substantially independent of the larger radii, if the radii are substantially different.

Guidelines for solder wettable pads, solder wettable reservoirs, and solder bumps according to some embodiments of the present invention are provided below.

1.) Reservoir Design
   a. Relatively sharp interior angles may be provided.
      i. Relatively high surface tension liquids such as molten solder constrained to a two dimensional surface may tend to form a meniscus (a bridge or short cut) at an interior angle. Any chamfer of the corner may exacerbate the problem and may lead to extraneous bump formation.
   b. Wide bights may be provided.
      i. A tendency to bridge across a bight (U-shaped section) of a reservoir path may depend on a width of the bight and a length of the meniscus. If the menisci of the two corners overlap there may be a possibility that they will merge and form a metastable bridge over the bight. Bights with openings wider than 2.5 times the radius of curvature may thus be provided.

c. Narrow tributary mouths may be provided.
i. Mouths of tributaries (where branches meet the main reservoir) may create localized regions of low pressure because both principal radii may be relatively large. The intersection may be kept narrow enough that the low pressure does not create a large upwelling that can become super-hemispheric resulting in a runaway situation. Both the tributary and the main reservoir may thus be narrowed by at least 20% at the mouth of tributaries.

d. Spacing may heed a flow progression.
i. As a reservoir soldershed drains, distant ends may drain first. Solder may build up at mouths of tributaries, creating temporary mounds of molten solder that may be relatively large. Since the wetting angles are relatively large, the drained ends may not merge with the mounds because the ends may have a relatively low profile.
ii. Therefore, spacing between ends of a reservoir and other portions of the reservoir can be at reduced and/or minimum dimensions. Reservoir channels may require additional spacing to allow for the increase in width during flow. Tributary mouths may require further spacing to allow for the temporary expansion during reflow.

e. Sluices may be flared.
i. A timing of flow progression can be adjusted by introducing restrictions in a flow path. A flared narrowing in the reservoir may create a sluice that can slow a rate of fluid flow. A build-up of liquid at bends, tributary mouths, and other locations may thus be reduced and/or prevented.

2.) Pad Design
a. Reservoir to pad edge angle may be acute to reduce any meniscus.
b. Narrow dimension may be greater than the widest reservoir narrow dimension
i. More particularly, a narrow pad dimension may be >10% larger than a widest reservoir narrow dimension.

Figure 11:
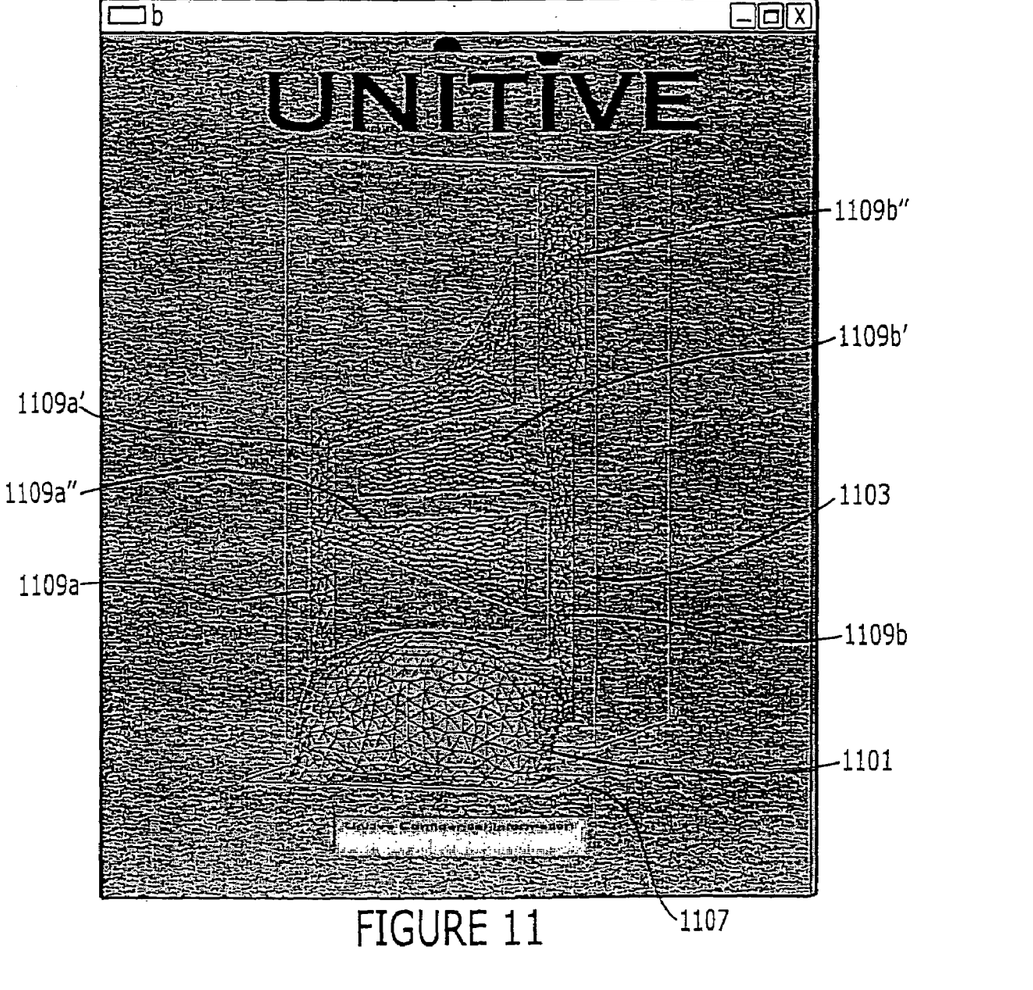

FIG. 11 illustrates representative structures according to embodiments of the present invention. Here, a structure 55 Φm (micron) wide, 225 Φm (micron) long, and 20 Φm (micron) thick may result in an overhang of 21 Φm (micron). In FIG. 11, a solder bump 1101 on a first substrate 1103 (such as an integrated circuit die) may overhang an edge of the substrate 1103 for bonding with a pad of a second substrate 1107 (such as a printed circuit board, another integrated circuit die, etc.). Reservoirs 1109a-b may be coupled with opposite ends of the solder bump 1101, and the reservoirs may have one or more bends therein to reduce an amount of substrate space consumed. Moreover, one or both of the reservoirs may include a plurality of branches. For example, the reservoir 1109a may include branches 1109a' and 1109a", and the reservoir 1109b may included branches 1109b' and 1109b". In addition, one or more reservoirs and/or branches may include a flared sluice.

More particularly, solder may be plated to a uniform thickness in the reservoir and bump regions so that the plated solder in the bump region does not interfere when dicing the substrate from a wafer including the substrate. Once the substrate has been diced, the plated solder can be heated above its melting temperature so that solder flows from the reservoirs and branches thereof (1109a, 1109a', 1109a", 1109b, 1109b', and 1109b") to the bump 1101. Accordingly, the solder bump 1101 can expand laterally beyond the edge of the substrate 1103 for bonding with substrate 1107.

Figure 12:
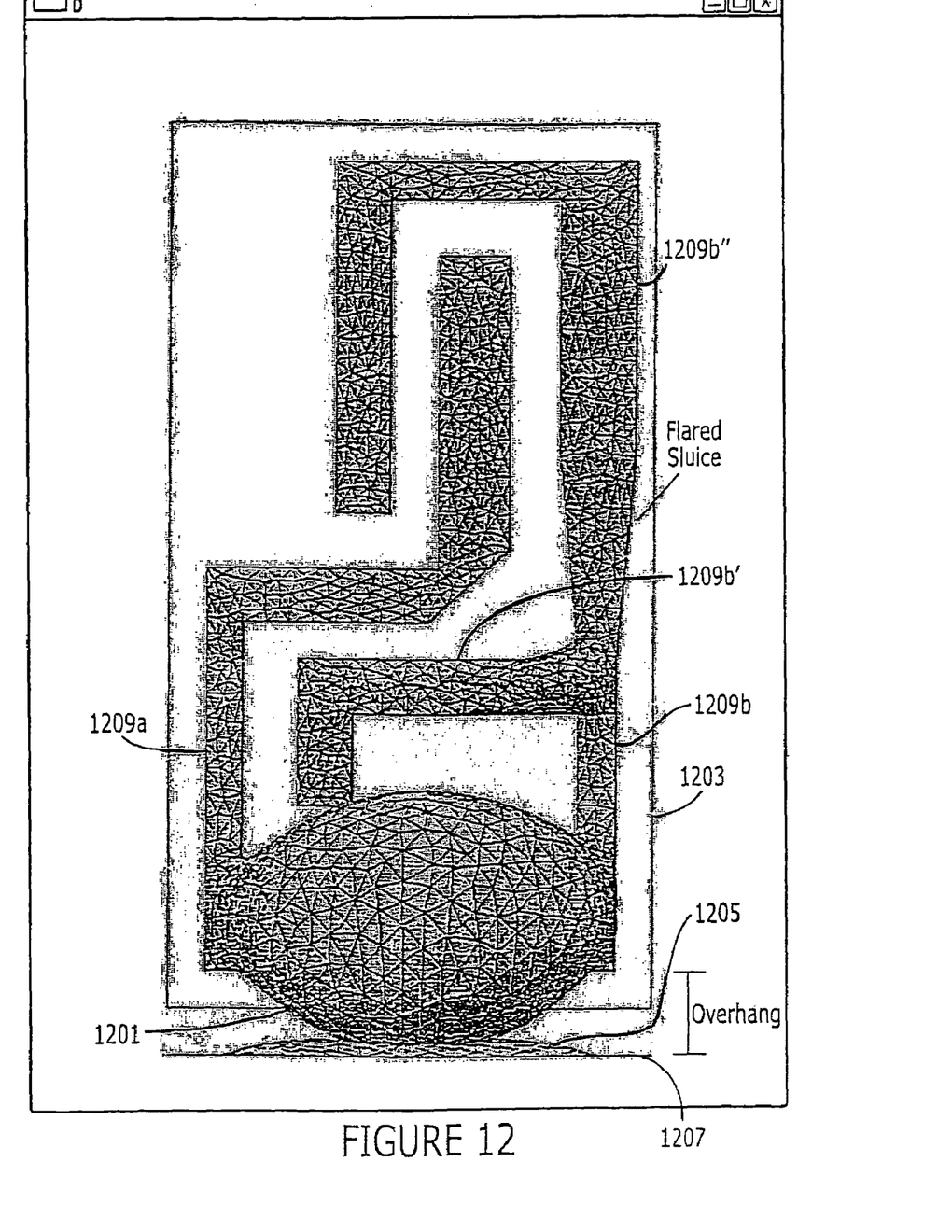

Structures according to additional embodiments of the invention are shown in FIG. 12. In FIG. 12, a solder bump 1201 on a first substrate 1203 may overhang an edge of the substrate 1203 (such as an integrated circuit die) for bonding with a pad 1205 of a second substrate 1207 (such as a printed circuit board, another integrated circuit die, etc.). Reservoirs 1209a-b may be coupled with opposite ends of the solder bump 1201, and the reservoirs may have one or more bends therein to reduce an amount of substrate space consumed. Moreover, one or both of the reservoirs may include a plurality of branches. For example, the reservoir 1209b may include branches 1209b' and 1209b". In addition, one or more reservoirs and/or branches may include a flared sluice.

More particularly, solder may be plated to a uniform thickness in the reservoir and bump regions so that the plated solder in the bump region does not interfere when dicing the substrate from a wafer including the substrate. Once the substrate has been diced, the plated solder can be heated above its melting temperature so that solder flows from the reservoirs and branches thereof (1209a, 1209b, 1209b', and 1209b") to the bump 1201. Accordingly, the solder bump 1201 can expand laterally beyond the edge of the substrate 1203 for bonding with substrate 1207.

Figure 13A:
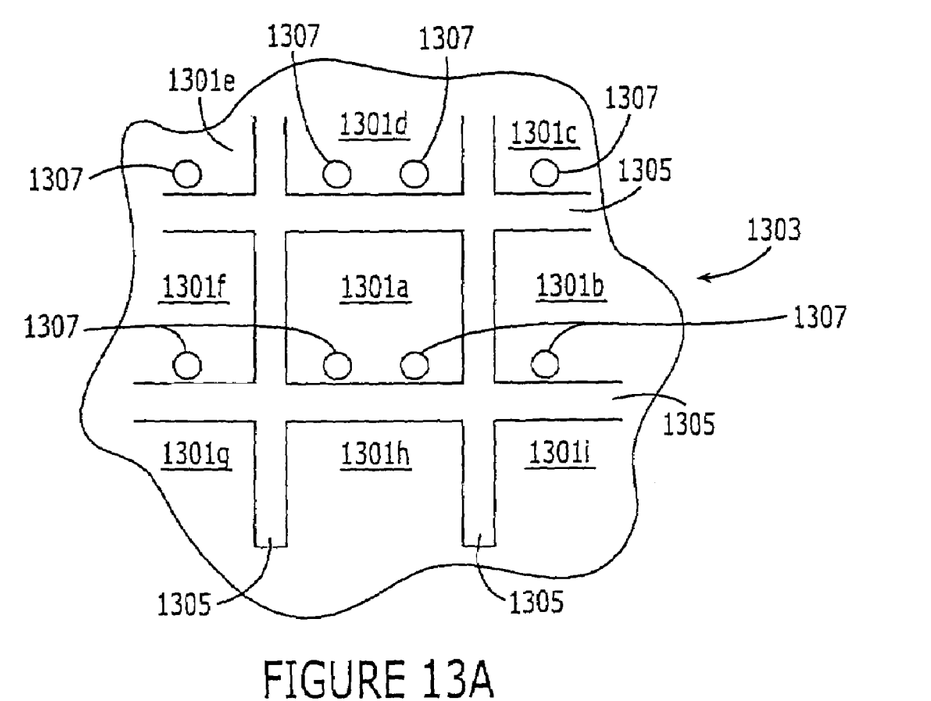
FIGS. 13A-C are plan views illustrating steps of forming solder structures according to embodiments of the present invention.
Figure 13B:
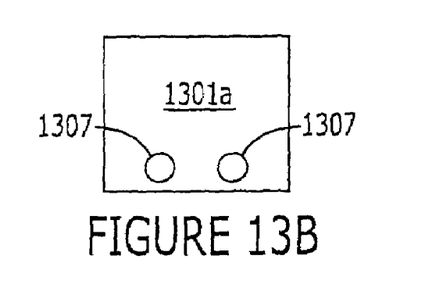
Figure 13C:
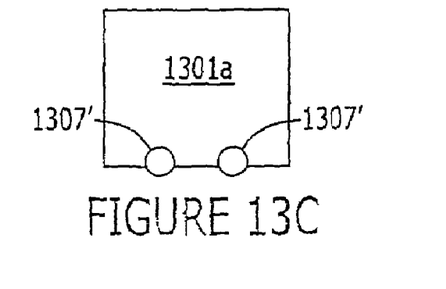

FIGS. 13A-C are plan views illustrating steps of forming solder structures according to embodiments of the present invention. As shown in FIG. 13A, a plurality of microelectronic die 1301a-i (also referred to as substrates) may be formed on a semiconductor wafer 1303, and the microelectronic die 1301a-i may be separated by streets 1305. Each of the die 1301a-i, for example, may be an integrated circuit device including a plurality of electronic devices such as transistors, diodes, resistors, capacitors, inductors, etc. Moreover, a plurality of solder bumps 1307 may be formed on respective solder wettable pads (not shown) on the microelectronic die 1301a-i.

For example, a continuous seed layer may be formed across the wafer 1303, and the seed layer may be used as a plating electrode to selectively electroplate the solder bumps 1307 through a plating mask or template. The plating mask or template and portions of the seed layer not covered by the solder bumps may then be removed. Portions of the seed layer remaining between respective solder bumps 1307 and die 1301a-i may make up the solder wettable pads. For example, the seed layer and the resulting solder wettable pads may include an adhesion layer (such as a layer of titanium, tungsten, chrome, and/or combinations thereof) and a conduction layer (such as a layer of copper). Each of the solder wettable pads may also include a conductive barrier layer (such as a layer of nickel, platinum, palladium, and/or combinations thereof) which may be provided as a portion of a continuous seed layer or which may be electroplated prior to electroplating the solder bumps.

As shown in FIG. 13A, the solder bumps 1307 are maintained within edges of the respective die 1301a-i before separating the individual die from the wafer, and the die may be separated from the wafer 1303, for example, by sawing the wafer 1303 along streets 1305. Accordingly, the solder bumps do not interfere with sawing the wafer 1303, and the separated die 1301a of FIG. 13B may be provided with the solder bumps 1307 maintained inside edges of the die 1301a. Typically, a set back in the range of about 20 microns to about 200 microns may be provided between the solder bumps 1307 and the edge of the respective die 1301a-i.

After separating the die 1301a from the wafer 1303, the solder bumps may be heated to a reflow temperature so that the solder bumps 1307' extend laterally toward an edge of the die 1301a. As shown in FIG. 13C, the solder bumps 1307' may extend to and/or beyond the edge of the die 1301a. The solder wettable pads may be provided, for example, using structures discussed above with respect to FIGS. 2A-I, 3-9, 11, and/or 12 to provide that solder bumps 1307' extends laterally to and/or beyond the edge of the substrate after reflow. The solder bumps 1307' can thus provide interconnection to another substrate (such as another die and/or printed circuit board) provided along an edge thereof. Connection to another substrate is discussed, for example, in U.S. Pat. No. 5,963,793, the disclosure of which is hereby incorporated herein in its entirety by reference.

According to some embodiments of the present invention, the solder bumps 1307 may be set back from a nearest edge of the die 1301a by at least about 20 microns before reflow so that the solder bumps do not interfere with separation of the die 1301a from the wafer 1303. After reflow, the solder bumps 1307' may extend toward the nearest edge of the die 1301a. More particularly, the solder bumps 1307' may extend at least to within about 10 microns from the edge of the die 1301a after reflow. According to some embodiments, the solder bumps 1307' may extend at least to within about 5 microns of the edge of the die 1301a after reflow. As shown in FIGS. 13B and 13C, the solder bumps 1307 may be offset from an edge of the die 1301a before reflow by at least about 20 microns, and the solder bumps 1307' may extend to and/or beyond the edge of the die 1301a after reflow.

As used herein, the term solder wettable pad refers to one or more conductive layers provided between a solder bump and a substrate. A solder wettable pad may include an adhesion layer (such as a layer of titanium, tungsten, chrome, and/or combinations thereof), a conduction layer (such as a layer of copper), and/or a barrier layer (such as a layer of nickel, platinum, palladium, and/or combinations thereof). A solder bump may be a bump of one or more different solder materials. For example, a solder bump may include one or more of a single element, binary, ternary, and/or higher order solder; such as a lead-tin solder, a lead-bismuth solder, a lead-indium solder, a lead free solder, a tin-silver solder, a tin-silver-copper solder, an indium-tin solder, an indium-gallium solder, a gallium solder, an indium-bismuth solder, a tin-bismuth solder, an indium-cadmium solder, bismuth-cadmium solder, tin-cadmium, etc. Accordingly, a solder wettable pad may provide a surface that is wettable to a solder bump wherein the solder wettable surface of the solder wettable pad and the solder bump comprise different materials.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. A solder structure comprising:
   a substrate;
   a solder wettable pad on the substrate adjacent an edge of the substrate, the solder wettable pad having a length parallel to the edge of the substrate and a width perpendicular to the edge of the substrate wherein the length parallel to the edge of the substrate is greater than the width perpendicular to the edge of the substrate, and wherein the solder wettable pad is set back from the edge of the substrate by at least 20 microns; and
   a solder bump on the solder wettable pad wherein the solder bump extends laterally from the solder wettable pad toward the edge of the substrate at least to within 10 microns of the edge of the substrate.

2. A solder structure according to claim 1 wherein the solder bump extends laterally from the solder wettable pad beyond the edge of the substrate.

3. A solder structure according to claim 1 wherein the solder bump extends laterally from the solder wettable pad to the edge of the substrate.

4. A solder structure according to claim 1 further comprising:
   a solder wettable reservoir connected to the solder wettable pad, the solder wettable reservoir having a width at a connection with the solder wettable pad that is less than the width of the solder wettable pad.

5. A solder structure according to claim 4 wherein the width of the solder wettable pad is at least 10% greater than a greatest width of the solder wettable reservoir.

6. A solder structure according to claim 4 wherein an angle of a junction between the solder wettable pad and the solder wettable reservoir comprises an acute angle.

7. A solder structure according to claim 4 wherein the solder wettable reservoir includes a flared narrowing therein.

8. A solder structure according to claim 4 wherein the solder wettable reservoir includes a two branches that join at a junction with the junction being between the two branches and the connection with the solder wettable pad, wherein each branch narrows by at least 20% at the junction therebetween.

9. A solder structure according to claim 4 wherein the solder wettable reservoir includes a bight therein wherein the bight includes an opening at least 2.5 times a radius of curvature of the bight.

10. A solder structure according to claim 1 further comprising:
    first and second solder wettable reservoirs connected to opposing ends of the solder wettable pad.

11. A solder structure according to claim 10 wherein the connections of the solder wettable reservoirs to the solder wettable pad are separated by the length of the solder wettable pad parallel to the edge of the substrate.

12. A solder structure according to claim 10 wherein portions of the first and second solder wettable reservoirs connected to the solder wettable pad have respective widths that are less than the width of the solder wettable pad.

13. A solder structure according to claim 1 further comprising:
    a second substrate adjacent the edge of the first substrate, wherein the first and second substrates are not parallel and wherein the solder bump is connected to the second substrate.

14. A solder structure according to claim 13 wherein the first and second substrates are substantially orthogonal with respect to each other.

15. A solder structure according to claim 1 wherein the substrate comprises a microelectronic die.

16. A solder structure according to claim 1 wherein the solder wettable pad and the solder bump comprise different materials.

17. A solder structure according to claim 1 wherein the solder bump has a length parallel to the edge of the substrate and a width perpendicular to the edge of the substrate wherein the length of the solder bump parallel to the edge of the substrate is greater than the width of the solder bump perpendicular to the edge of the substrate.

18. A solder structure according to claim 17 wherein the solder wettable pad is set back from the edge of the substrate wherein the substrate includes solder non-wettable portions that are exposed between the solder wettable pad and the edge of the substrate, and wherein a distance between the solder bump and the solder non-wettable portions of the substrate increases with increasing distance from the solder wettable pad toward the edge of the substrate.

19. A solder structure according to claim 1, wherein the solder wettable pad and the solder bump comprise different materials, wherein the solder bump is directly on the solder wettable pad, and wherein a contact area between the solder bump and the solder wettable pad has a length parallel to the edge of the substrate that is greater than a width perpendicular to the edge of the substrate.

20. A solder structure according to claim 1, wherein the solder wettable pad comprises a first solder wettable pad and wherein the solder bump comprises a first solder bump, the solder structure further comprising:
   a second solder wettable pad on the substrate adjacent the edge of the substrate, the second solder wettable pad having a length parallel to the edge of the substrate and a width perpendicular to the edge of the substrate wherein the length parallel to the edge of the substrate is greater than the width perpendicular to the edge of the substrate, and wherein the first and second solder wettable pads are spaced apart; and
   a second solder bump on the second solder wettable pad wherein the second solder bump extends laterally from the second solder wettable pad toward the edge of the substrate at least to within 10 microns of the edge of the substrate, and wherein the first and second solder bumps are spaced apart.

21. A solder structure comprising:
   a substrate;
   a solder wettable pad on the substrate adjacent an edge of the substrate, the solder wettable pad having a length parallel to the edge of the substrate and a width perpendicular to the edge of the substrate wherein the length parallel to the edge of the substrate is greater than the width perpendicular to the edge of the substrate, and wherein the solder wettable pad is set back from the edge of the substrate; and
   a solder bump on the solder wettable pad wherein the solder bump extends laterally from the solder wettable pad beyond the edge of the substrate.

22. A solder structure according to claim 21 further comprising:
   at least one solder wettable reservoir connected to the solder wettable pad, the solder wettable reservoir having a width at a connection with the solder wettable pad that is less than the width of the solder wettable pad.

23. A solder structure according to claim 21 further comprising:
   first and second solder wettable reservoirs connected to opposing ends of the solder wettable pad wherein the connections of the solder wettable reservoirs to the solder wettable pad are separated by the length of the solder wettable pad parallel to the edge of the substrate.

24. A solder structure according to claim 23 wherein portions of the first and second solder wettable reservoirs connected to the solder wettable pad have respective widths that are less than the width of the solder wettable pad.

25. A solder structure according to claim 21 further comprising:
   a second substrate adjacent the edge of the first substrate, wherein the first and second substrates are not parallel and wherein the solder bump is connected to the second substrate.

26. A solder structure according to claim 21 wherein the substrate comprises a microelectronic die.

27. A solder structure according to claim 21 wherein the solder bump has a length parallel to the edge of the substrate and a width perpendicular to the edge of the substrate wherein the length of the solder bump parallel to the edge of the substrate is greater than the width of the solder bump perpendicular to the edge of the substrate.

28. A solder structure according to claim 27 wherein the solder wettable pad is set back from the edge of the substrate wherein the substrate includes solder non-wettable portions that are exposed between the solder wettable pad and the edge of the substrate, and wherein a distance between the solder bump and the solder non-wettable portions of the substrate increases with increasing distance from the solder wettable pad toward the edge of the substrate.

29. A solder structure according to claim 21, wherein the solder wettable pad and the solder bump comprise different materials, wherein the solder bump is directly on the solder wettable pad, and wherein a contact area between the solder bump and the solder wettable pad has a length parallel to the edge of the substrate that is greater than a width perpendicular to the edge of the substrate.

30. A solder structure according to claim 21, wherein the solder wettable pad comprises a first solder wettable pad and wherein the solder bump comprises a first solder bump, the solder structure further comprising:
   a second solder wettable pad on the substrate adjacent the edge of the substrate, the second solder wettable pad having a length parallel to the edge of the substrate and a width perpendicular to the edge of the substrate wherein the length parallel to the edge of the substrate is greater than the width perpendicular to the edge of the substrate, wherein the second solder wettable pad is set back from the edge of the substrate, and wherein the first and second solder wettable pads are spaced apart; and
   a second solder bump on the second solder wettable pad wherein the second solder bump extends laterally from the second solder wettable pad beyond the edge of the substrate, and wherein the first and second solder bumps are spaced apart.

31. A solder structure comprising:
   a first substrate;
   a solder wettable pad on the first substrate adjacent an edge of the first substrate, the solder wettable pad having a length parallel to the edge of the first substrate and a width perpendicular to the edge of the first substrate wherein the length parallel to the edge of the first substrate is greater than the width perpendicular to the edge of the first substrate, and wherein the solder wettable pad is set back from the edge of the substrate;
   a solder bump on the solder wettable pad; and
   a second substrate adjacent the edge of the first substrate, wherein the first and second substrates are not parallel and wherein the solder bump is connected to the second substrate.

32. A solder structure according to claim 31 wherein the first and second substrates are substantially orthogonal with respect to each other.

33. A solder structure according to claim 31 the solder wettable pad is set back from the edge of the substrate by at least 20 microns and wherein the solder bump extends laterally from the solder wettable pad toward the edge of the substrate at least to within 10 microns of the edge of the first substrate.

34. A solder structure according to claim 31 wherein the first substrate comprises a microelectronic die.

35. A solder structure according to claim 31 wherein the solder wettable pad and the solder bump comprise different materials.

36. A solder structure according to claim 31 further comprising:
- a solder wettable reservoir connected to the solder wettable pad, the solder wettable reservoir having a width at a connection with the solder wettable pad that is less than the width of the solder wettable pad.

37. A solder structure according to claim 36 wherein the width of the solder wettable pad is at least 10% greater than a greatest width of the solder wettable reservoir.

38. A solder structure according to claim 31 wherein the solder bump has a length parallel to the edge of the substrate and a width perpendicular to the edge of the substrate wherein the length of the solder bump parallel to the edge of the substrate is greater than the width of the solder bump perpendicular to the edge of the substrate.

39. A solder structure according to claim 38 wherein the solder wettable pad is set back from the edge of the substrate wherein the substrate includes solder non-wettable portions that are exposed between the solder wettable pad and the edge of the substrate, and wherein a distance between the solder bump and the solder non-wettable portions of the substrate increases with increasing distance from the solder wettable pad toward the edge of the substrate.

40. A solder structure according to claim 31, wherein the solder wettable pad and the solder bump comprise different materials, wherein the solder bump is directly on the solder wettable pad, and wherein a contact area between the solder bump and the solder wettable pad has a length parallel to the edge of the substrate that is greater than a width perpendicular to the edge of the substrate.

41. A solder structure according to claim 31, wherein the solder wettable pad comprises a first solder wettable pad and wherein the solder bump comprises a first solder bump, the solder structure further comprising:
- a second solder wettable pad on the second first substrate adjacent the edge of the first substrate, the second solder wettable pad having a length parallel to the edge of the first substrate and a width perpendicular to the edge of the first substrate wherein the length parallel to the edge of the first substrate is greater than the width perpendicular to the edge of the first substrate, and wherein the first and second solder wettable pads are spaced apart; and
- a second solder bump on the second solder wettable pad wherein the second solder bump is connected to the second substrate, and wherein the first and second solder bumps are spaced apart.

* * * * *